United States Patent
Tanimizu et al.

(10) Patent No.: US 10,200,005 B2
(45) Date of Patent: Feb. 5, 2019

(54) OUTPUT NOISE REDUCTION DEVICE

(71) Applicant: KITAGAWA INDUSTRIES CO., LTD., Inazawa-shi, Aichi-ken (JP)

(72) Inventors: Tomokazu Tanimizu, Nagoya (JP); Kazushige Ueno, Gifu (JP); Katsuyuki Morita, Ama-gun (JP)

(73) Assignee: KITAGAWA INDUSTRIES CO., LTD., Inazawa-shi (JP)

( * ) Notice: Subject to any disclaimer, the term of this patent is extended or adjusted under 35 U.S.C. 154(b) by 315 days.

(21) Appl. No.: 15/270,577

(22) Filed: Sep. 20, 2016

(65) Prior Publication Data

US 2017/0012592 A1    Jan. 12, 2017

Related U.S. Application Data

(63) Continuation of application No. PCT/JP2015/077261, filed on Sep. 28, 2015.

(30) Foreign Application Priority Data

Sep. 30, 2014 (JP) .................................. 2014-202082

(51) Int. Cl.
*H03H 1/00* (2006.01)
*H01F 17/06* (2006.01)
(Continued)

(52) U.S. Cl.
CPC .................. *H03H 1/00* (2013.01); *H01F 3/14* (2013.01); *H01F 17/06* (2013.01); *H01F 27/02* (2013.01);
(Continued)

(58) Field of Classification Search
USPC ................................................. 361/117–119
See application file for complete search history.

(56) References Cited

U.S. PATENT DOCUMENTS

| 5,189,592 A | 2/1993 | Kauffman |
| 5,195,232 A | 3/1993 | Frederick |

(Continued)

FOREIGN PATENT DOCUMENTS

| JP | S62-142407 A | 6/1987 |
| JP | H10-106861 A | 4/1998 |

(Continued)

OTHER PUBLICATIONS

Apr. 4, 2017 International Preliminary Report on Patentability issued in Interational Patent Application No. PCT/JP2015/077261.
(Continued)

*Primary Examiner* — Danny Nguyen
(74) *Attorney, Agent, or Firm* — Oliff PLC

(57) ABSTRACT

An object is to provide an output-noise reduction device in which a component encapsulated through insert molding can be appropriately protected.
In a noise filter module (output-noise reduction device), a conducting bar and a magnetic body core are protected with a molded member formed through insert molding. The molded member is formed of a resin material with a molding shrinkage rate of 0.5% or less. Thus, the amount of shrinkage after the molded member is molded and stress as a result of the shrinkage can be made small, whereby damage on the magnetic body core, deformation of a lead frame, and the like can be prevented from occurring.

2 Claims, 5 Drawing Sheets

(51) Int. Cl.
  *H01F 27/02* (2006.01)
  *H01F 27/06* (2006.01)
  *H01F 27/29* (2006.01)
  *H05K 9/00* (2006.01)
  *H01G 4/38* (2006.01)
  *H01F 3/14* (2006.01)

(52) U.S. Cl.
  CPC .......... *H01F 27/022* (2013.01); *H01F 27/06* (2013.01); *H01F 27/29* (2013.01); *H01G 4/38* (2013.01); *H05K 9/00* (2013.01); *H01F 2017/065* (2013.01); *H03H 2001/0021* (2013.01)

(56) References Cited

U.S. PATENT DOCUMENTS

| | | | |
|---|---|---|---|
| 7,179,990 B2 | 2/2007 | Kanazawa | |
| 7,642,452 B2 | 1/2010 | Kanazawa et al. | |
| 8,119,048 B2 | 2/2012 | Nishimura | |
| 9,276,546 B2* | 3/2016 | Craig | H01F 27/26 |
| 9,345,160 B2 | 5/2016 | Fukumasu et al. | |
| 2006/0021779 A1 | 2/2006 | Kanazawa | |
| 2006/0260834 A1 | 11/2006 | Kanazawa et al. | |
| 2008/0100400 A1* | 5/2008 | Lucas | H05K 9/0066 333/181 |
| 2010/0014232 A1 | 1/2010 | Nishimura | |
| 2012/0055826 A1 | 3/2012 | Nishimura | |
| 2014/0240946 A1 | 8/2014 | Fukumasu et al. | |

FOREIGN PATENT DOCUMENTS

| | | |
|---|---|---|
| JP | 2005-093536 A | 4/2005 |
| JP | 2006-074988 A | 3/2006 |
| JP | 2009-224933 A | 10/2009 |
| JP | 2012-166567 A | 9/2012 |
| JP | 2013-099057 A | 5/2013 |
| JP | 2013-188915 A | 9/2013 |

OTHER PUBLICATIONS

Nov. 3, 2017 Search Report issued in European Patent Application No. 15847762.0.
May 4, 2018 Office Action issued in Chinese Patent Application No. 201580014787.X.
Dec. 8, 2015 Search Report issued in International Patent Application No. PCT/JP2015/077261.

* cited by examiner

OUTPUT NOISE REDUCTION DEVICE

CROSS-REFERENCE TO RELATED APPLICATION

This application is based upon and claims the benefit of priority of the prior Japanese Patent Application No. 2014-202082, filed on Sep. 30, 2014, the entire contents of which are incorporated herein by reference.

FIELD

A technique disclosed in the present application relates to an output-noise reduction device that reduces noise mixed in output voltage and the like flowing in a conducting bar, and particularly relates to a structure of fixing the conducting bar.

BACKGROUND

Switching noise at operation frequency of an electronic device and the like as well as its harmonic frequency might be mixed in output voltage and an output signal output from a switching power supply and other electronic devices via a conducting bar. Such switching noise might negatively affect supplying devices such as an external electronic device, and thus needs to be reduced as appropriate. The switching power supply outputs output voltage of a predetermined voltage value through a switching operation of a power transistor. When the power transistor is turned ON and OFF, the current path is switched, and this might generate noise at a switching frequency and its harmonic frequency depending on a rated output. The noise is superimposed on the output voltage to be transmitted to the supplying device via the conducting bar and negatively affects the supplying device. Thus, a device for reducing such noise needs to be provided. In one known output-noise reduction device, a conducting bar is inserted in a magnetic body core to form a noise filter for removing the noise flowing in the conducting bar (see, for example, Patent Literature 1).

[Patent Literature 1] Japanese Laid-open Patent Publication No. 2005-93536

SUMMARY

An output-noise reduction device according to a technique disclosed in the present application is a device configured to output to a supplying device, an output signal from an electronic device, and to reduce noise mixed in the output signal. The output-noise reduction device includes a magnetic body core, a conducting bar, a lead frame, and a molded member. The magnetic body core has a through hole. The conducting bar is inserted in the magnetic body core, and has one end portion serving as a connection portion to be connected to the electronic device, and another end portion serving as an output portion connected to the supplying device. The conducting bar serves as a path in which the output signal or the like output from the electronic device to the supplying device is transmitted. The lead frame is connected to a plurality of capacitive elements, and is fixed to the output portion of the conducting bar. The molded member is formed through insert molding, and encapsulates the lead frame, the magnetic body core and the conducting bar inserted in the magnetic body core. The molded member is made of a resin material of which a molding shrinkage rate after the insert molding is 0.5% or less. The molding shrinkage rate represents a shrinkage rate of the resin material in the course of curing after the insert molding. For example, the molding shrinkage rate is a ratio (shrinkage rate) of a dimension of an object that has been molded and cured by cooling to a dimension of a mold used for the insert molding.

The object and advantages of the invention will be realized and attained by means of the elements and combinations particularly pointed out in the claims.

It is to be understood that both the forgoing general description and the following detailed description are exemplary and explanatory and are not restrictive of the invention.

DESCRIPTION OF EMBODIMENTS

For example, in the output-noise reduction device of this type, a conducting bar and a magnetic body core may be protected by being encapsulated through insert molding. In this case, a resin material with an appropriate property needs to be selected or there will be a problem that a defect including a damage on the encapsulated member such as the magnetic body core and separation of the encapsulating resin might occur.

The technique disclosed in the present application is made in view of the problem described above, and an object thereof is to provide an output-noise reduction device in which a member encapsulated through insert molding can be appropriately protected.

Figure 1:
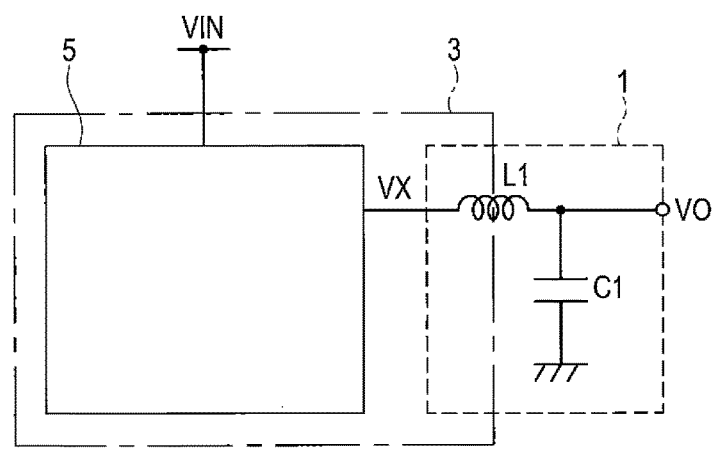
FIG. 1 is a circuit diagram illustrating a configuration in which a noise filter module as an example of an output-noise reduction device according to an embodiment is connected to a switching power supply.

One embodiment of the present invention is described with reference to the drawings. FIG. 1 is a circuit diagram illustrating a noise filter module 1, as one example of an output-noise reduction device according to the present application, in a state where the noise filter module 1 is connected between an output terminal VX of a switching power supply 5 and an output terminal VO. The switching power supply 5 is accommodated in a metal casing 3 made by aluminum die casting and the like. For example, the switching power supply 5 is an on-vehicle power supply and is a step-down switching power supply that steps down a voltage value of driving power supply voltage VIN supplied from an in battery (not illustrated) in a hybrid vehicle, an electric vehicle, or the like, and supplies resultant power to an auxiliary battery (not illustrated). The auxiliary battery supplies power supply voltage to on-vehicle electronic devices such as an audio device, an air conditioner device, and a lighting device.

The switching power supply 5 performs ON/OFF control on a power transistor (not illustrated) at a predetermined switching frequency f to obtain an output of predetermined voltage. In the switching power supply 5, a current path is switched with the power transistor turned ON and OFF in accordance with such a switching operation, whereby alternate voltage fluctuation occurs between high voltage and low voltage at the switching frequency f. In the switching power supply 5, current, corresponding to load current, alternately and thus intermittently flows from the power supply voltage VIN and to ground potential GND, whereby current fluctuation occurs. Thus, in the switching power supply 5, the voltage fluctuation and the current fluctuation due to the switching operation might be a cause of switching noise at the switching frequency f and its harmonic frequency. For example, such switching noise might be transmitted to the output terminal VX as conductive noise, transmitted in a circumventing manner through a signal path and ground wiring, and inductive noise, transmitted through a space due to electromagnetic coupling such as capacitive coupling.

In the switching power supply 5 according to the present embodiment, the noise filter module 1 is connected to the output terminal VX. The noise filter module 1 has what is known as an LC filter structure with a choke coil L1 provided in an output voltage path connecting between the output terminal VX of the switching power supply 5 and the output terminal VO, and a capacitor C1 connected between the output terminal VO and the ground potential GND. The switching frequency f in the switching power supply 5 depends on the rated output power and specifications of components. For example, some switching power supplies installed in vehicles are operated at several hundred kHz. In such a case, the switching frequency f and its harmonic frequency might overlap with frequency band of an on-vehicle AM radio receiver, and the noise filter module 1 can reduce noise transmitted on the signal path in such a band.

Figure 2:
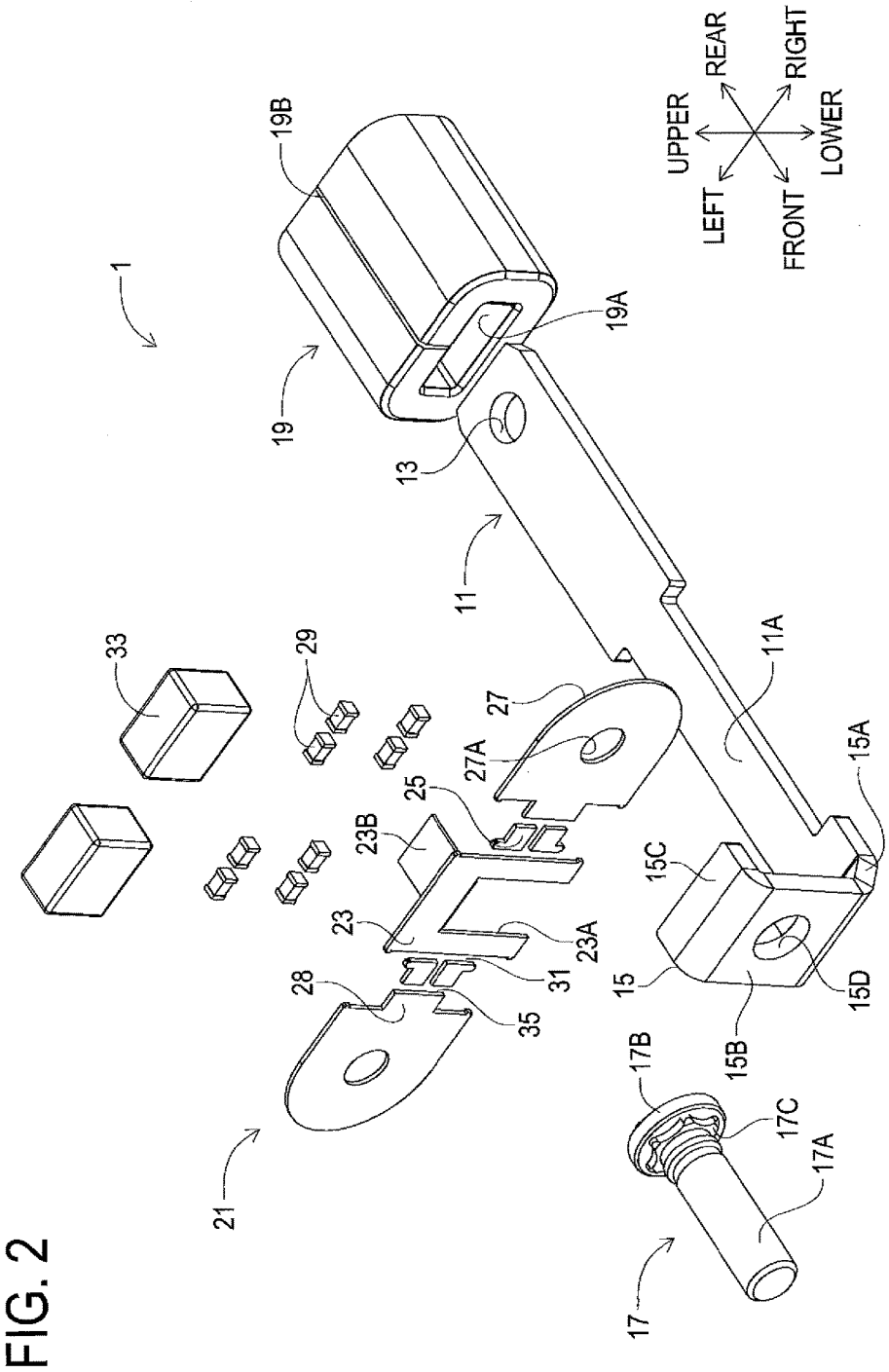
FIG. 2 is an exploded perspective view of the noise filter module.
Figure 3:
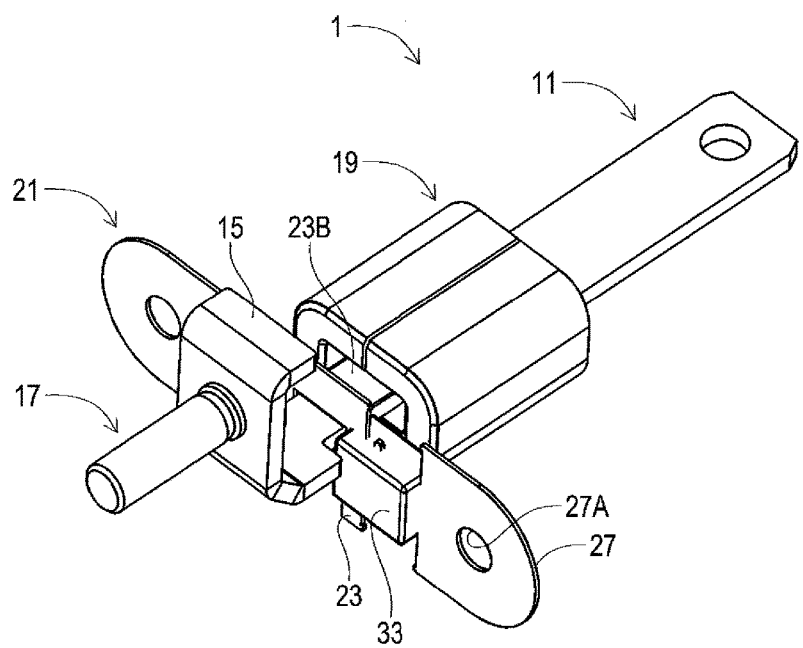
FIG. 3 is a perspective view illustrating the noise filter module in a state as a result of primary molding.
Figure 4:
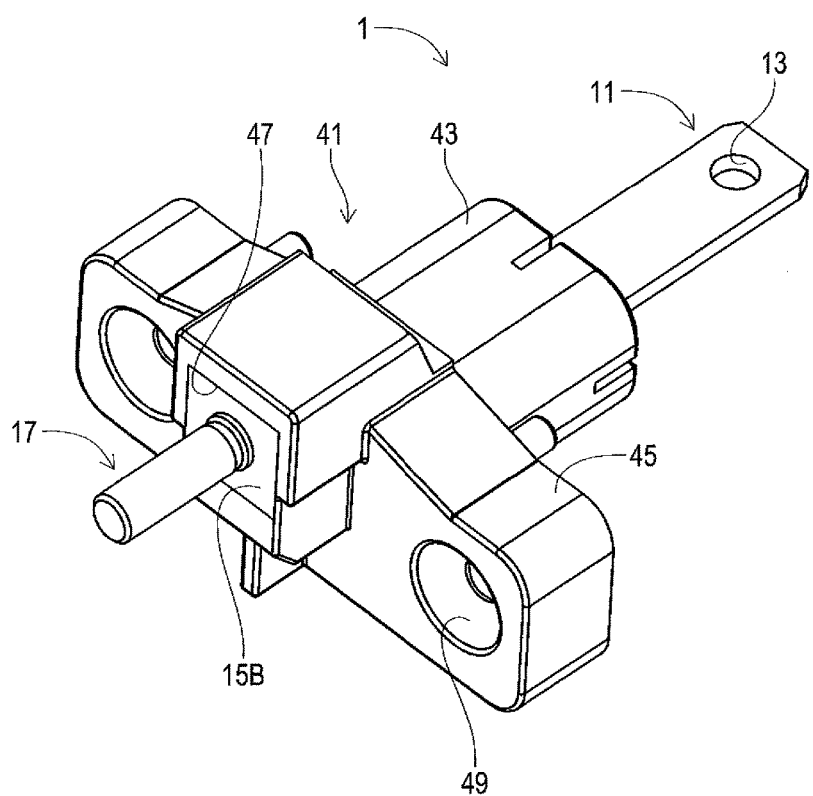
FIG. 4 is a perspective view illustrating the noise filter module in a state as a result of secondary molding.

Next, a shape/structure of the noise filter module 1 will be described. FIG. 2 is an exploded perspective view of the noise filter module 1. FIG. 3 is a perspective view of the noise filter module 1 in a state as a result of primary molding. FIG. 4 is a perspective view of the noise filter module 1 in a state as a result of secondary molding.

As illustrated in FIG. 2, the noise filter module 1 includes a conducting bar 11, a bolt 17, a magnetic body core 19, a lead frame 21, and the like. The output voltage path, connecting between the output terminal VX of the switching power supply 5 and the output terminal VO illustrated in FIG. 1, mainly includes the conducting bar 11 illustrated in FIG. 2. The conducting bar 11 is formed to have a rectangular plate shape elongated in a single direction. The following description is given with a longitudinal direction of the conducting bar 11 defined as a front and rear direction, a direction orthogonal to a flat plate portion of the conducting bar 11 defined as an upper and lower direction, and a direction orthogonal to the front and rear direction and to the upper and lower direction defined as a left and right direction, as illustrated in FIG. 2. The conducting bar 11 is formed to have a substantially rectangular shape extending in the front and rear direction, as viewed from above.

For example, the conducting bar 11 is made of a metal material such as copper or aluminum. The conducting bar 11 may be made of a metal material such as chrome molybdenum steel or carbon steel for example in case the conducting bar 11 needs mechanical strength in particular. The conducting bar 11 has an end portion on a rear side (right side in FIG. 2) provided with a connection hole 13 formed through the upper and lower direction. The conducting bar 11 has the connection hole 13 connected to the output terminal VX of the switching power supply 5 disposed in the metal casing 3 illustrated in FIG. 1.

The conducting bar 11 has a bent portion 15 that is on a front side (left side in FIG. 2) and has a distal end portion bent toward the above. The bent portion 15 includes a first curved portion 15A, a bolt connecting portion 15B, and a second curved portion 15C. The first curved portion 15A continues from the distal end portion of the conducting bar 11, and is curved upward by a predetermined angle. The bolt connecting portion 15B continues from a distal end portion of the first curved portion 15A, and has planes in parallel with the upper and lower direction and the left and right direction. The bolt connecting portion 15B has a center portion provided with an insertion hole 15D formed through the front and rear direction, and the bolt 17 is fixed in the insertion hole 15D. The second curved portion 15C continues from the upper end portion of the bolt connecting portion 15B and is bent rearward by a predetermined angle.

The bolt 17 includes an output terminal portion 17A and a latching portion 17B. The output terminal portion 17A has a circular column shape extending in the front and rear direction, and has an outer circumference surface provided with a male screw (not illustrated) used for fixing to a connection terminal of the auxiliary battery and the like through screwing. In the bolt 17, the latching portion 17B is integrally formed with a rear end surface of the output terminal portion 17A. The latching portion 17B expands in the radial direction from the center axis of the output terminal portion 17A extending along the front and rear direction, to have a disk shape with a larger diameter than the output terminal portion 17A. Thus, the circular latching portion 17B has the center positioned on the center axis of the output terminal portion 17A having the circular column shape.

The latching portion 17B has a surface on the front side (on a side of the output terminal portion 17A) provided with a step portion 17C as a step in the axial direction of the latching portion 17B. The step portion 17C expands to be in a substantially star shape surrounding the output terminal portion 17A, as viewed from the front. The bolt 17 is press fit into the insertion hole 15D in a direction from the rear side of the bolt connecting portion 15B toward the front, and is fixed with the step portion 17C fit in the insertion hole 15D. The bolt 17 and the front surface of the bolt connecting portion 15B exposed from a secondary molded member 41 described later (see FIG. 4) serve as the output terminal VO to be connected to the supplying device on the subsequent stage.

The magnetic body core 19 includes a hollow portion 19A formed through the front and rear direction, and thus has a hollow cylindrical shape. For example, the magnetic body core 19 is made by sintering a magnetic material such as ferrite. The magnetic body core 19 has an ellipsoidal shape expanding in the left and right direction, as viewed in the front and rear direction. Thus, the hollow portion 19A has the ellipsoidal shape expanding in the left and right direction as viewed in the front and rear direction, to have a larger width than the conducting bar 11 in the left and right direction, whereby the conducting bar 11 can be inserted.

The conducting bar 11 includes a core attachment portion 11A with a smaller width in the left and right direction than the width of a portion where the connection hole 13 is formed. The core attachment portion 11A has a uniform width in the left and right direction, in a section from substantially the center portion of the conducting bar 11 in the front and rear direction to the vicinity of the front end portion. The choke coil L1 (see FIG. 1) is formed with the conducting bar 11 inserted in the hollow portion 19A of the magnetic body core 19 in such a manner that the inner side surface of the hollow portion 19A faces the core attachment portion 11A of the conducting bar 11.

The magnetic body core 19 has a slit 19B as a notch, in the upper and lower direction, on an upper side one (on the upper side in FIG. 2) of portions opposed to each other in the upper and lower direction. The slit 19B serves as what is known as a core gap, and extends in the front and rear direction while passing through the center portion of the magnetic body core 19 in the left and right direction. With the slit 19B, a partially discontinuous magnetic path is achieved in the circumference direction of the magnetic body core 19. The magnetic resistance of the magnetic body core 19 can be adjusted by changing the width and the like of the slit 19B, so that the magnetic saturation can be prevented from occurring. In the noise filter module 1, the inductance of the choke coil L1 needed for removing the noise component can be ensured with the magnetic saturation thus prevented by adjusting the width of the slit 19B of the magnetic body core 19.

The lead frame 21 includes a first fixing portion 23, connecting portions 25, and second fixing portions 27. The lead frame 21 is made of a highly conductive metal material (such as brass or copper for example). The first fixing portion 23 includes: a notch portion 23A formed by partially notching a substantially square plate shape member; and a joint portion 23B formed by bending the notched portion. The joint portion 23B is bent rearward to a position where the plane of the notched portion is orthogonal to the upper and lower direction. The joint portion 23B has a rectangular shape as viewed in the upper and lower direction. The notch portion 23A is formed in such a manner that opening is formed at the center of a lower end portion. Thus, the first fixing portion 23 has a substantially upside-down U shape with a lower side open as viewed in the front and rear direction. As illustrated in FIG. 3, the lead frame 21 is fixed to the conducting bar 11, with the lower surface of the joint portion 23B fixed to the upper surface of the core attachment portion 11A by welding or the like, in a state where the core attachment portion 11A is inserted in the notch portion 23A of the first fixing portion 23. The lead frame 21 is electrically connected to the conducting bar 11 via the joint portion 23B. The conducting bar 11 has a front end portion of the core attachment portion 11A attached to the lead frame 21 and has a rear side attached to the magnetic body core 19.

The connecting portions 25 couple between the first fixing portion 23 and the second fixing portions 27, when the chip capacitors 29 are mounted thereon. The connecting portions 25 according to the present embodiment are fainted as a pair of pieces that are opposed to each other in the upper and lower direction and is disposed on each of left and right sides of the first fixing portion 23. The chip capacitors 29 are mounted on an end portion of each connecting portion 25 on the inner side in the left and right direction and a corresponding one of end portions of the first fixing portion 23 on the outer side in the left and right direction, with a slit 31 provided between the end portions. Similarly, the chip capacitors 29 are mounted on an end portion of each connecting portion 25 on the outer side in the left and right direction and an end portion of the second fixing portion 27 on the inner side, with a slit 35 provided between the end portions.

Thus, the four chip capacitors 29 are mounted between each of the second fixing portions 27, opposing each other in the left and right direction, and the first fixing portion 23.

The four chip capacitors 29 are two pairs of two chip capacitors 29, connected in series, mounted in parallel. The bent portion 15 and the bolt 17 form the output terminal VO (see FIG. 1). The ground potential GND is supplied to the second fixing portions 27 via a fastening member (such as a bolt) fastened to the metal casing 3 for the switching power supply 5 described later by screwing. Thus, the chip capacitors 29 form the capacitor C1 (FIG. 1).

The second fixing portions 27 are each formed to have a plate shape with a plane orthogonal to the front and rear direction, and each have an end portion on the inner side in the left and right direction provided with a protruding portion 28 protruding inward, and the chip capacitors 29 are mounted on the protruding portion 28. The second fixing portions 27 each have an arch-shaped end portion on the outer side in the left and right direction. The second fixing portions 27 each have a fixing hole 27A into which an unillustrated bolt or the like is inserted into in the front and rear direction to fix the secondary molded member 41 (see FIG. 4) of the encapsulated noise filter module 1 to the metal casing 3. The second fixing portions 27 are each fixed with the fastening member, such as the bolt inserted in the fixing hole 27A, fastened to an attachment portion of the metal casing 3.

For example, the lead frame 21 can be formed through the following steps. First of all, a flat metal plate is punched by a punching process and the like, whereby members that are supposed to be the first fixing portion 23, the connecting portions 25, and the second fixing portions 27 are fanned in a state of being bridged by thin metal wires. Then, the chip capacitors 29 are mounted by soldering and the like. Next, parts of the first fixing portion 23 and the second fixing portions 27, as well as the chip capacitors 29 and the connecting portion 25 are encapsulated with an insulating material such as a resin material, whereby a primary molded member 33 is formed. The resin material used for the primary molded member 33 includes phenol resin, epoxy resin, unsaturated polyester, and the like. The parts of the first fixing portion 23 and the second fixing portions 27, as well as the chip capacitors 29 and the connecting portions 25 have their relative positions fixed with the primary molded member 33 thus formed. Then, the bridging portions of the thin metal wires are cut, whereby the lead frame 21 illustrated in FIG. 3 is formed.

FIG. 4 illustrates the secondary molded member 41 obtained by further encapsulating the noise filter module 1 with thermoset resin, after the primary molded member 33 illustrated in FIG. 3 is formed. The secondary molded member 41 includes: a core molded member 43 that entirely encapsulates an outer circumference surface of the magnetic body core 19; and a frame molded member 45 that entirely encapsulates the lead frame 21 with the primary molded member 33 formed, by insert molding for example. Thus, a resin material applying no excessive pressure to the magnetic body core 19 such as phenol resin is used as the thermoset resin used for forming the secondary molded member 41.

The bolt 17 protrudes from a front side end surface of the frame molded member 45, and an opening 47 from which the front side surface of the bolt connecting portion 15B provided in the bent portion 15 is exposed is formed in the frame molded member 45. A fixing hole 49 is formed through the frame molded member 45 in the front and rear direction, at a position corresponding to the fixing hole 27A (see FIG. 2) of the second fixing portion 27, and the fastening member such as a bolt is inserted in the fixing hole 49. The bolt or the like is fastened while being in direct contact with an exposed part of the second fixing portions 27. Thus, the fixing hole 49 has an inner diameter defining an opening size large enough not to cause contact and interference between the inner circumference surface of the fixing hole 49 and the bolt and the like for the fastening. For example, the metal casing 3 (see FIG. 1) is provided with a protruding portion protruding forward at a position corresponding to the fixing hole 49, and the attachment portion where the bolt or the like is fastened fainted at the protruding portion. In the noise filter module 1, the protruding portion of the metal casing 3 is inserted through the fixing hole 49 of the secondary molded member 41 from the rear side, and the bolt inserted from the front side is fastened for fixing, in a state where the protruding portion is in close contact with the second fixing portions 27 exposed from the fixing hole 49.

In the noise filter module 1 described above, the conducting bar 11 and the magnetic body core 19 are protected with the secondary molded member 41 formed by insert molding to encapsulate various members. Various defects occur if a resin material with an appropriate property is not selected to be used for the secondary molded member 41. The magnetic body core 19 is made by sintering a magnetic material, and thus is a hard and brittle material with a small elastic coefficient. Thus, the magnetic body core 19 might be cracked or partially damaged by stress as a result of shrinkage of resin, forming the secondary molded member 41, after the insert molding. This means that the stress as a result of shrinkage of the secondary molded member 41 needs to be small enough not to overwhelm the breaking strength of the magnetic body core 19. The stress as a result of shrinkage of the secondary molded member 41 might even cause deformation of the lead frame, the conducting bar, and the like. The resin of the secondary molded member 41 encapsulating the lead frame 21 might be separated as a result of shrinkage after the molding, and thus, a gap might be formed. In view of this, a resin material with a smaller molding shrinkage rate is used for the secondary molded member 41 in the noise filter module 1 of the present embodiment. Thus, the amount of shrinkage of the secondary molded member 41 after the molding and the stress as a result of the shrinkage are made small, whereby the damage of the magnetic body core 19 and the like can be prevented from occurring. With this configuration featuring a small shrinkage rate of the secondary molded member 41 after the molding, the gap and the like can be prevented from forming due to the separation of the secondary molded member 41 from the lead frame 21 and the like.

Examples of the thermoset resin used for the secondary molded member 41 include unsaturated polyester (BMC), Phenol resin (PF), and Epoxy resin (EP). For example, the secondary molded member 41 may be formed with any other thermoplastic resin featuring a small molding shrinkage rate including Polybutylene Terephthalate containing glass fibers (PBT (GF)), Polyphenylene sulfide (PPS), and Polyamide resin containing glass fibers (PA (GF)). The present inventors have made vigorous studies and found out that a resin material used for the secondary molded member 41 preferably has the mold shrinkage rate of 0.5% or less.

In the noise filter module 1 actually used in a vehicle and the like after being completed by the molding, components of the noise filter module 1 each deform due to expansion or shrinkage in accordance with temperature difference and a linear expansion coefficient of the component, when the temperature change corresponding to a used environment (such as an engine room) occurs. When the magnitude of deformation of the components such as the conducting bar 11, the lead frame 21, and the magnetic body core 19 is different from the magnitude of the deformation of the secondary molded member 41 encapsulating the components, the stress corresponding to the difference in the deformation is generated. Thus, the damage on the magnetic body core 19 or the like might occur. To achieve equal magnitude of deformation among the components to prevent such a defect, the difference between the secondary molded member 41 and the components such as the conducting bar 11 in linear expansion coefficient is preferably made small as much as possible.

The linear expansion coefficient may be defined based on a component (magnetic body core 19) that is likely to be damaged for example, as in the case of the molding shrinkage rate described above. For example, the ratio of the linear expansion coefficient of the resin material forming the secondary molded member 41 to the linear expansion coefficient of the magnetic body core 19 is small and is preferably in the range from 0.7 to 3. Ideally, the linear expansion coefficient of the resin material used for the secondary molded member 41 and all the components including the magnetic body core 19 is preferably of a uniform value about 11 ppm/° C. for example. Thus, even when the deformation due to the temperature change in the used environment occurs in the secondary molded member 41, the magnitude of the deformation is close to those of the other components. Thus, the damage on the magnetic body core 19, the deformation of the lead frame 21 and the conducting bar 11, and the like can be prevented from occurring.

When the noise filter module 1 of the present embodiment is installed in a vehicle and the like to be used for a long period of time in a used environment involving repeated cooling and heating, separation might occur at an interface between the portion exposed from the secondary molded member 41, such as a front side surface of the bolt connecting portion 15B for example, and the secondary molded member 41. Furthermore, the separation might occur at an interface between the second fixing portion 27 exposed from the fixing hole 49 and the secondary molded member 41. As a result, liquid due to condensation enters the module to cause defects such as rusting and short circuiting. In view of this, in the noise filter module 1 in the present embodiment, the resin material used for the secondary molded member 41 has the properties of the small molding shrinkage rate and uniform linear expansion coefficient, and also has properties such as high fluidity and excellent transcription. The high fluidity represents high adhesion (wettability) for the resin material in the mold for insert molding to flow along the surface shapes of the lead frame 21 and the conducting bar 11. The excellent transcription represents a property of achieving filling up closely for the detailed shapes formed on metal surfaces of the lead frame 21 and the conducting bar 11 for example.

For example, in some cases, the thermoplastic resin is filled with glass fibers to achieve high strength. However, tangling occurs in the resin containing glass fibers to impair the fluidity. The strength and the fluidity of the resin material can be adjusted by adjusting the amount of glass fibers mixed in the resin. The wettability of the resin material can be selected based on the contact angle with respect to metal for example.

The adhesion between the resin material used for the secondary molded member 41 and the other components (such as the lead frame 21 and the conducting bar 11) described above can be improved by performing plating treatment on the conducting bar 11 for example. For example, tin plating may be performed on the conducting bar 11 to improve adhesion with respect to the secondary molded member 41.

Figure 5:
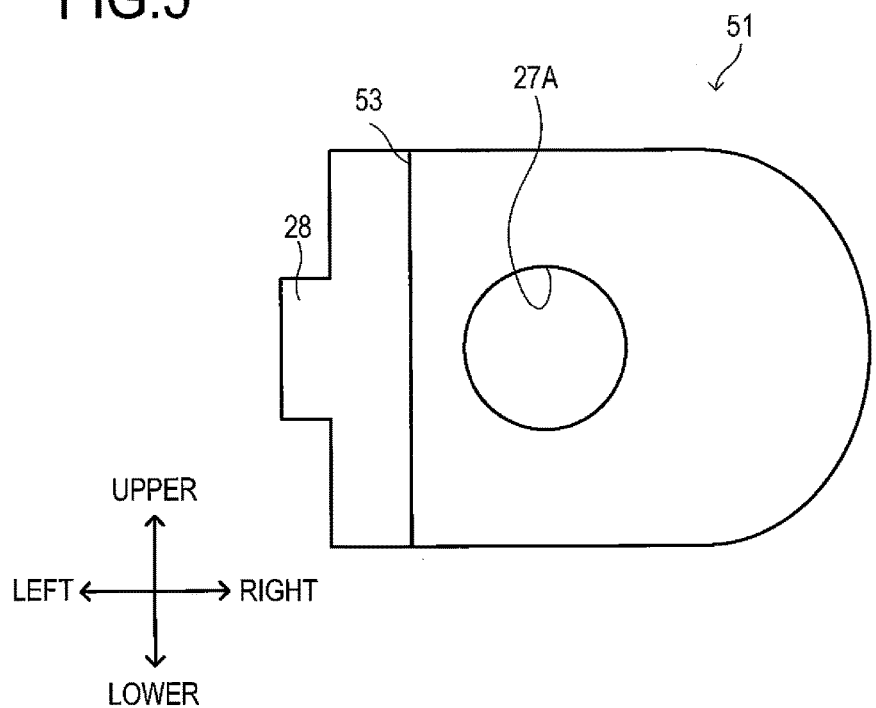
FIG. 5 is a plan view of a second fixing portion in another example.

Alternatively, the noise filter module 1 may have a configuration including a bent portion for preventing further advancement of water and the like that has entered through a portion where the resin of the secondary molded member 41 is separated, a portion where the lead frame 21 is deformed, or the like. FIG. 5 is a plan view illustrating a second fixing portion 51 different from the second fixing portion 27 described above. The second fixing portion 51 illustrated in FIG. 5 corresponds to a front side view of the right one of the second fixing portions 27 in FIG. 2 as viewed in the front and rear direction. In the description on the second fixing portion 51 below, the configurations that are the same as those of the second fixing portion 27 will be denoted with the same reference numerals, and the description thereof is omitted as appropriate.

Figure 6:
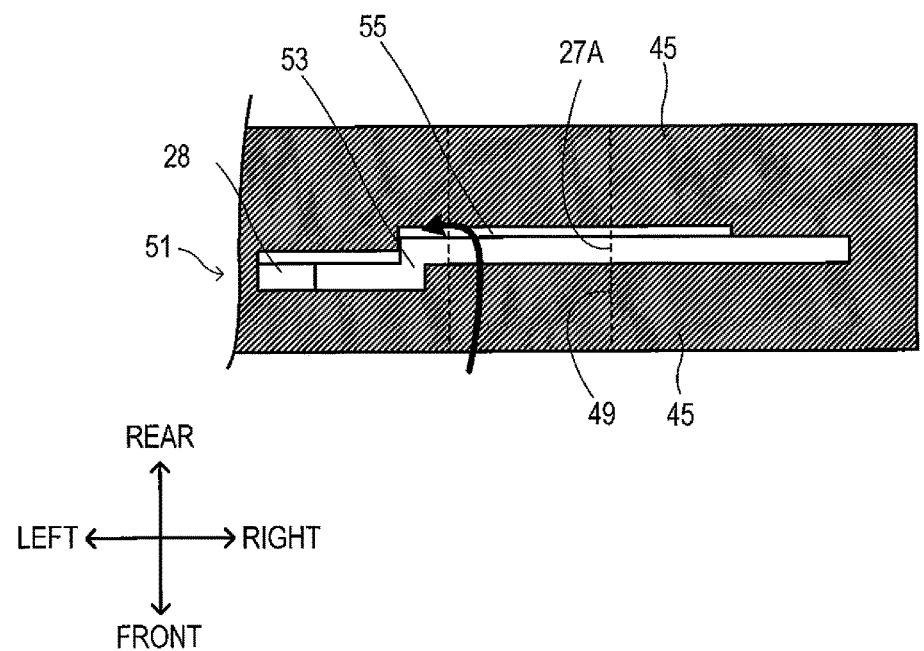
FIG. 6 is a schematic cross-sectional view of the second fixing portion in the other example as viewed from above.

The second fixing portion 51 has a bead 53, serving as the bent portion, provided on the left side of the fixing hole 27A (side of the protrusion 28) in the left and right direction. As illustrated in FIG. 6, the bead 53 is formed in a portion extending from a portion of the second fixing portion 51 exposed from the fixing hole 27A, and encapsulated by the frame molded member 45. The bead 53 has a crank shape that is bent toward the front and then bent at the distal end of this bent portion toward the right, as viewed from above. FIG. 6 is a cross-sectional view illustrating the second fixing portion 51 as viewed from above, and illustrates a part of the frame molded member 45 encapsulating the second fixing portion 51. For example, a gap 55 is formed due to separation of a part of resin of the frame molded member 45 from the second fixing portion 51. Then, liquid enters into the gap 55 through a part of the fixing hole 27A in a direction indicated by an arrow in the figure. In this configuration, the liquid can only enter the gap 55. More specifically, with the bead 53 cranked in the front and rear direction provided as described above, even if the gap 55 is formed due to separation of a part of resin of the frame molded member 45 from the second fixing portion 51 in the front and rear direction, a portion of the resin of the frame molded member 45 and the bead 53 are in close contact with each other after the separation in the right and left direction. Thus, further advancement of the liquid that has entered and moving along the surface of the second fixing portion 51 can be prevented at the portion where the bead 53 is formed. The shape, the structure, and the like of the bead 53 illustrated in FIGS. 5 and 6 are merely an example, and can be changed as appropriate. For example, a plurality of the beads 53 may be formed. The bead 53 may have a sinewave shape, a triangular wave shape, a rectangular wave shape, or the like as viewed from above.

In the noise filter module 1 in the present embodiment, the secondary molded member 41 encapsulates the conducting bar 11 in which the output voltage from the switching power supply 5 flows. Thus, a defect that the heat produced at the conducting bar 11 and the magnetic body core 19 (Joule heat of the conducting bar 11 and the like for example) is accumulated in the secondary molded member 41 might occur. In view of this, for example, aluminum hydroxide may be mixed in the resin material used for the secondary molded member 41 to achieve high heat conduction. For example, thermoset resin featuring desired heat conduction while maintaining its hardness to serve as the molded member can be achieved with the aluminum hydroxide mixed in the thermoset resin in a range from 30 to 80%. Thus, the heat produced in the secondary molded member 41 can be transferred to the outside, whereby the accumulated heat can be effectively reduced.

The noise filter module 1 is an example of an output-noise reduction device. The switching power supply 5 is an example of an electronic device. The output voltage is an example of an output signal. An auxiliary battery and an on-vehicle electronic device, such as an audio device, an air conditioning device, and a lighting device, receiving power supply voltage from the auxiliary battery are each an example of a supplying device. A terminal on a side of the connection hole 13 of the conducting bar 11 is an example of a connection portion. The bolt 17 fixed to the bent portion 15 of the conducting bar 11 is an example of an output portion. The hollow portion 19A is an example of a through hole of the magnetic body core 19. The front and rear direction is an example of an insertion direction in which the conducting bar 11 is inserted in the magnetic body core 19. The chip capacitor 29 is an example of a capacitive element. The secondary molded member 41 is an example of a molded member. The bead 53 is an example of a bent portion.

It is a matter of course that the technique disclosed in the present application is not limited to the embodiments described above, and can be modified and changed in various ways without departing from the gist of the present application.

For example, it is a matter of course that the properties of the secondary molded member 41 described in the embodiment described above can be similarly applied to the primary molded member 33.

The secondary molded member 41 in the embodiment described above may encapsulate only the lead frame 21 or the magnetic body core 19.

The slit 19B formed on the magnetic body core 19 to prevent the magnetic saturation from occurring may be omitted depending on the physical configuration and the like of the magnetic body core 19.

With the output-noise reduction device according to the technique disclosed in the present application, the components encapsulated through insert molding can be appropriately protected.

The technical idea derived from the content of the embodiment described above is described below.

An output-noise reduction device configured to output to a supplying device, an output signal from an electronic device, and to reduce noise mixed in the output signal, the output-noise reduction device comprising:

a magnetic body core that is made of a magnetic material and has a through hole;

a conducting bar that is made of a conductive material, inserted in the through hole of the magnetic body core, and has one end portion serving as a connection portion to be connected to the electronic device, and another end portion serving as an output portion connected to the supplying device;

a lead frame to which a plurality of capacitive elements are connected, the lead frame being made of a conductive material and fixed to the output portion of the conducting bar; and a molded member that is made of resin material, formed through insert molding, and encapsulates the lead frame, the magnetic body core, and the conducting bar inserted in the magnetic body core, wherein a ratio of a linear expansion coefficient of the resin material forming the molded member to a linear expansion coefficient of the magnetic body core is in a range from 0.7 to 3.

For example, the linear expansion coefficient represents that rate of the thermal expansion to the temperature change in a case where the molded member after the insert molding is used in a used environment. In the output-noise reduction device, when the temperature change corresponding to the used environment occurs, deformation of components, including the magnetic body core, the conducting bar, the lead frame, and the molded members, occurs due to the expansion or the shrinkage. The magnitude of the deformation is based on the temperature difference and the linear expansion coefficient of each of the components. When the magnitude of the deformation of the molded member is different from the magnitude of the deformation of any other component such as the conducting bar, the stress is generated between the molded member and this other component. For example, this might lead to a damage or the like on the magnetic body core. Thus, the difference between the molded member and each of the components in the linear expansion coefficient is preferably made small as much as possible. For example, the magnetic body core is made by sintering a magnetic material, and thus is a hard and brittle material with a small elastic coefficient that is largely affected by the stress as a result of the deformation of the molded member. In view of this, in the output-noise reduction device, the ratio of the linear expansion coefficient of the resin material forming the molded member to the linear expansion coefficient of the magnetic body core is set to be within a range from 0.7 to 3. Thus, the damage on the magnetic body core or the like can be prevented from occurring.

An output-noise reduction device according to a technique disclosed in the present application is a device configured to output to a supplying device, an output signal from an electronic device, and to reduce noise mixed in the output signal. The output-noise reduction device includes a magnetic body core, a conducting bar, a lead frame, and a molded member. The magnetic body core has a through hole. The conducting bar is inserted in the magnetic body core, and has one end portion serving as a connection portion to be connected to the electronic device, and another end portion serving as an output portion connected to the supplying device. The conducting bar serves as a path in which the output signal or the like output from the electronic device to the supplying device is transmitted. The lead frame is connected to a plurality of capacitive elements, and is fixed to the output portion of the conducting bar. The molded member is formed through insert molding, and encapsulates the lead frame, the magnetic body core and the conducting bar inserted in the magnetic body core. The molded member is made of a resin material of which a molding shrinkage rate after the insert molding is 0.5% or less. The molding shrinkage rate represents a shrinkage rate of the resin material in the course of curing after the insert molding. For example, the molding shrinkage rate is a ratio (shrinkage rate) of a dimension of an object that has been molded and cured by cooling to a dimension of a mold used for the insert molding.

In the output-noise reduction device, the molded member is formed by insert molding to protect the conducting bar and the magnetic body core. The magnetic body core is formed by sintering a magnetic material for example, and might be cracked or partially damaged by stress as a result of the shrinkage of the resin forming the molded member, depending on the molding shrinkage rate after the insert molding. Furthermore, the molded member has a risk that a gap might be formed between the lead frame and the resin separated from the lead frame and the like due to the shrinkage after the insert molding. In view of this, in the output-noise reduction device, the molded member is made of the resin material with very small molding shrinkage rate which is 0.5% or less. Thus, the amount of shrinkage of the molded member after the molding and the stress as a result of the shrinkage are made small, whereby the damage on the magnetic body core, the deformation of the lead frame, and the like can be prevented from occurring. Furthermore, in this configuration, a gap and the like can be prevented from being formed due to separation of resin forming the molded member from the lead frame and the like.

In the output-noise reduction device of the present application, at least one of the lead frame and the conducting bar may have a portion exposed from the molded member, a bent portion obtained by bent process may be formed in a portion that extends from the exposed portion and may be encapsulated by the molded member, and the bent portion may restrict movement of liquid that has entered though an interface between the molded member and the exposed portion of the at least one of the lead frame and the conducting bar. In this output-noise reduction device, the at least one of the lead frame and the conducting bar has the portion exposed from the molded member. The bent portion obtained by bent process is formed in a portion that extends from the exposed portion and is encapsulated by the molded member. Thus, even when partial separation occurs at an interface between the exposed portion and the molded member, further advancement of liquid that has entered can be prevented with a portion formed where the bent portion and the resin forming the molded member come into close contact with each other.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. An output-noise reduction device configured to output to a supplying device, an output signal from an electronic device, and to reduce noise mixed in the output signal, the output-noise reduction device comprising:
   a magnetic body core that is made of a magnetic material and has a through hole;
   a conducting bar that is made of a conductive material, inserted in the through hole of the magnetic body core, and has one end portion serving as a connection portion to be connected to the electronic device, and another end portion serving as an output portion connected to the supplying device;
   a lead frame to which a plurality of capacitive elements are connected, the lead frame being made of a conductive material and fixed to the output portion of the conducting bar; and
   a molded member that is made of resin material, formed through insert molding, and encapsulates the lead frame, the magnetic body core, and the conducting bar inserted in the magnetic body core,
   wherein the molded member is made of the resin material of which a molding shrinkage rate after the insert molding is 0.5% or less.

2. The output-noise reduction device according to claim 1,
wherein at least one of the lead frame and the conducting bar has a portion exposed from the molded member,
wherein a bent portion obtained by bent process is formed in a portion that extends from the exposed portion and encapsulated in the molded member, and
wherein the bent portion restricts movement of liquid that has entered though an interface between the molded member and the exposed portion of the at least one of the lead frame and the conducting bar.

* * * * *